US012658415B2

(12) United States Patent
Kim

(10) Patent No.: US 12,658,415 B2
(45) Date of Patent: Jun. 16, 2026

(54) THIN FILM FORMING APPARATUS AND METHOD

(71) Applicant: SEMES CO., LTD., Chungcheongnam-do (KR)

(72) Inventor: Sun Il Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 18/092,212

(22) Filed: Dec. 31, 2022

(65) Prior Publication Data

US 2024/0112897 A1 Apr. 4, 2024

(30) Foreign Application Priority Data

Oct. 4, 2022 (KR) ........................ 10-2022-0126196

(51) Int. Cl.
*H01J 37/34* (2006.01)
*C23C 14/34* (2006.01)
*C23C 14/54* (2006.01)

(52) U.S. Cl.
CPC ............ *H01J 37/347* (2013.01); *C23C 14/34* (2013.01); *C23C 14/54* (2013.01);
(Continued)

(58) Field of Classification Search
CPC .. H01J 37/347; H01J 37/3414; H01J 37/3476; H01J 2237/047; H01J 2237/332;
(Continued)

(56) References Cited

U.S. PATENT DOCUMENTS 4,853,102 A * 8/1989 Tateishi ............ H01J 37/32688
204/298.25
5,455,197 A * 10/1995 Ghanbari .............. C23C 14/351
204/298.03
(Continued)

FOREIGN PATENT DOCUMENTS

JP S5531142 A * 3/1980
JP 6-93438 4/1994
(Continued)

OTHER PUBLICATIONS

JPS5531142A Translation (Year: 1980).*
(Continued)

*Primary Examiner* — Patrick S Ott
(74) *Attorney, Agent, or Firm* — WOMBLE BOND DICKINSON (US) LLP

(57) ABSTRACT

A thin-film forming apparatus and method are provided. A thin-film forming apparatus includes a chamber configured to hold a vacuum formed in the chamber, a deposition object placed at a set position inside the chamber, a sputtering target placed inside the chamber and containing particles for deposition, a gas supply module configured to supply a gas for forming a plasma state inside the chamber, a step-coverage control module located inside the chamber and facing the deposition object, and a voltage supply module located inside the chamber and configured to supply an electric current to the sputtering target, wherein the deposition object is deposited with the particles provided from the sputtering target based on the electric current, and wherein the step-coverage control module is configured to control a step coverage of the deposition object by adjusting an amount of the particles moving toward the deposition object through a repositioning maneuver.

18 Claims, 6 Drawing Sheets

(52) U.S. Cl.
CPC ...... *H01J 37/3414* (2013.01); *H01J 37/3476*
(2013.01); *H01J 2237/047* (2013.01); *H01J*
*2237/332* (2013.01)

(58) Field of Classification Search
CPC .............. H01J 37/3455; H01J 37/3438; H01J
37/3411; C23C 14/34; C23C 14/54
See application file for complete search history.

(56) References Cited

U.S. PATENT DOCUMENTS

| | | | | |
|---|---|---|---|---|
| 2004/0238125 A1* | 12/2004 | Ono | .................. | H01J 37/32623 |
| | | | | 156/345.46 |
| 2021/0140029 A1* | 5/2021 | Ow | ..................... | H01J 37/3426 |

FOREIGN PATENT DOCUMENTS

| | | |
|---|---|---|
| JP | 2015-28193 | 2/2015 |
| KR | 10-1046955 | 7/2011 |
| KR | 10-2013-0070994 | 6/2013 |
| KR | 10-1802384 | 11/2017 |
| KR | 10-2018-0032423 | 3/2018 |

OTHER PUBLICATIONS

Office Action dated Sep. 10, 2024 for Korean Patent Application No. 10-2022-0126196 and its English translation from Global Dossier.
Notice of Allowance dated May 22, 2025 for Korean Patent Application No. 10-2022-0126196 and its English translation from Global Dossier.

* cited by examiner

[FIG. 1]
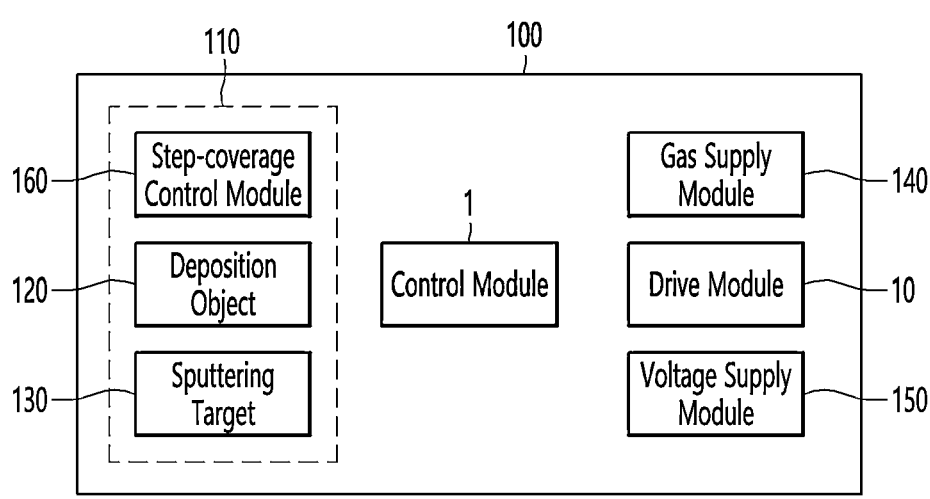

[FIG. 2]
100
1  Control Module
11  First Drive Module
162    161    163    110
12  Second Drive Module
13  Third Drive Module
120
140  Gas Supply Module
150  Voltage Supply Module
L2  L1  L3  130
160 { 161
      162
      163
[FIG. 3]
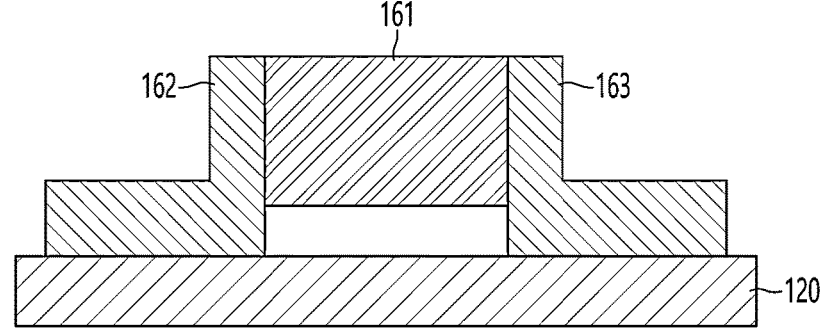
161
162    163
120

[FIG. 4]
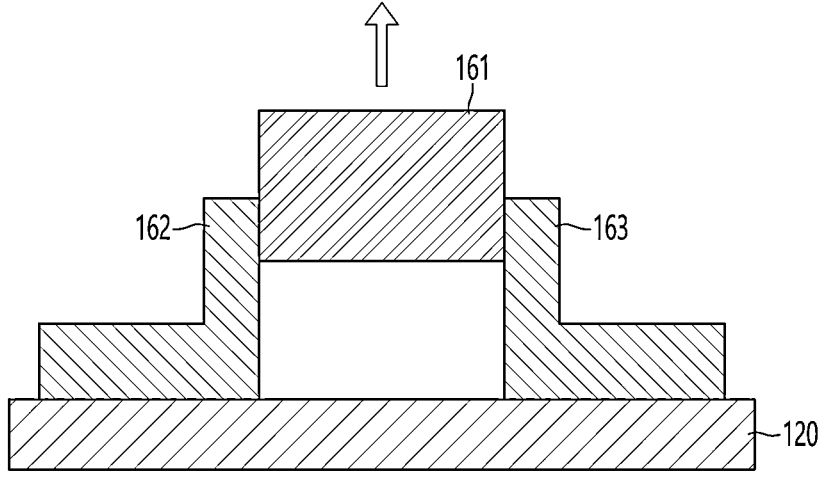
[FIG. 5]
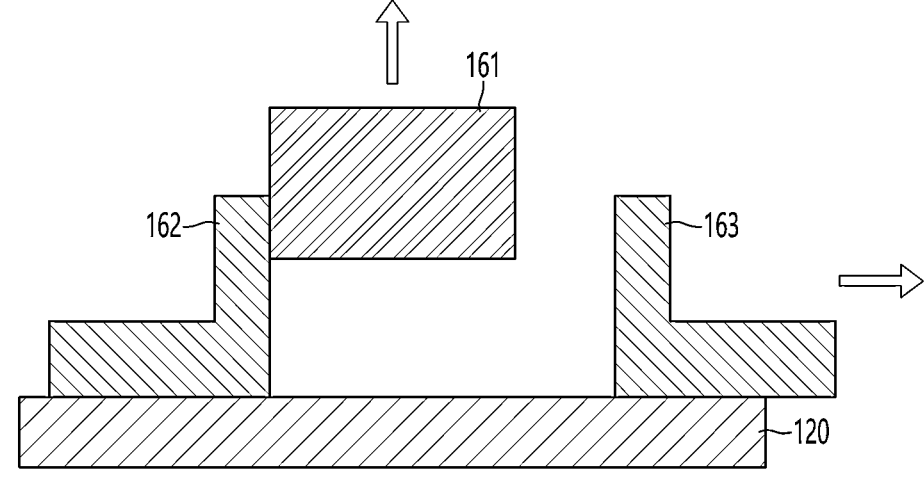
[FIG. 6]
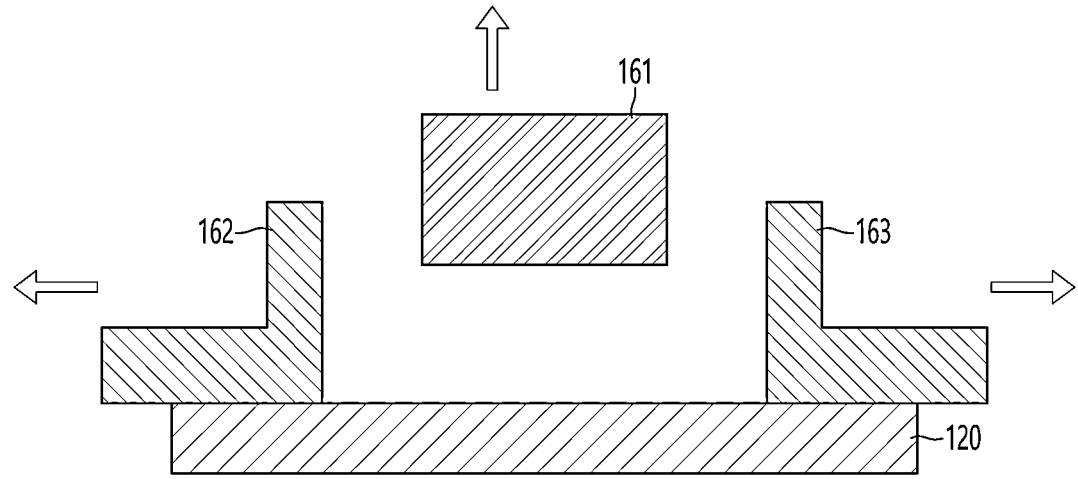

[FIG. 7]
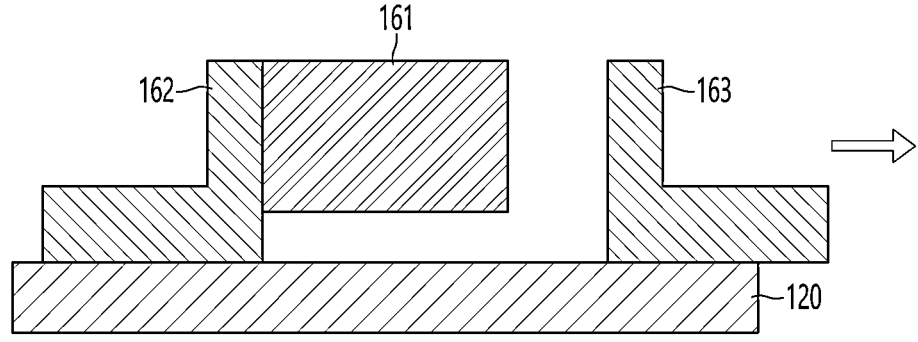
[FIG. 8]
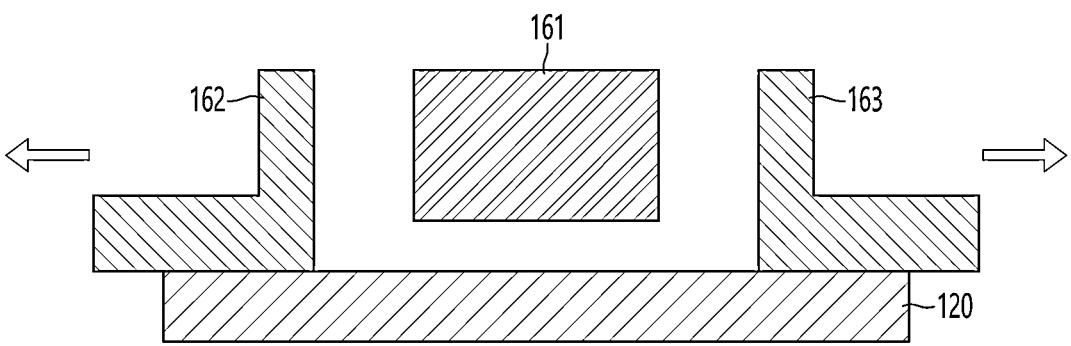
[FIG. 9]
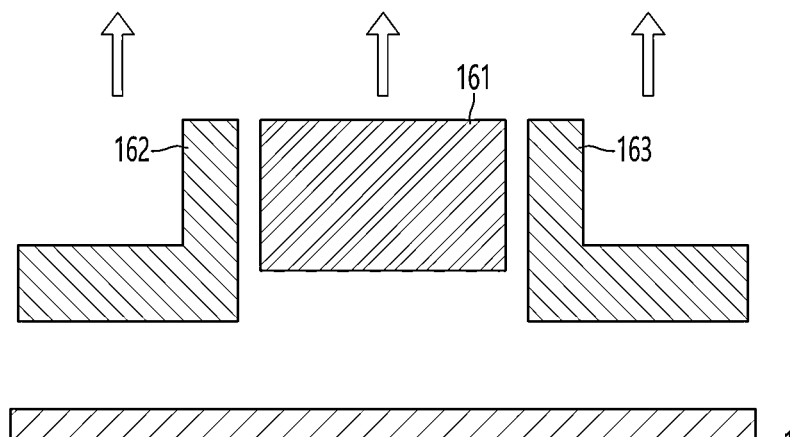

[FIG. 10A]
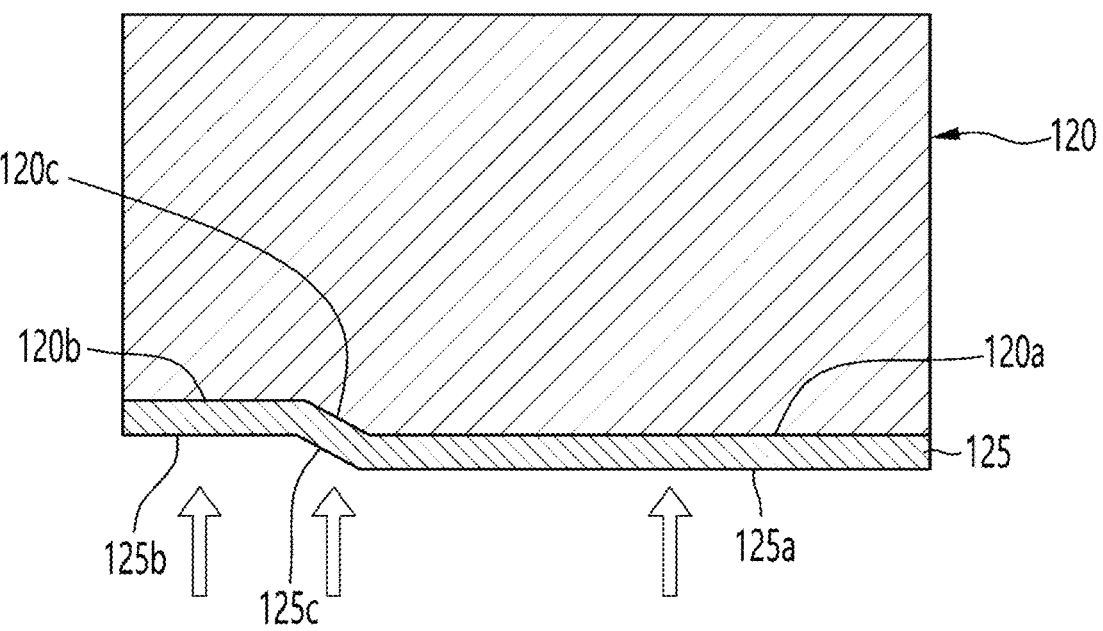
[FIG. 10B]
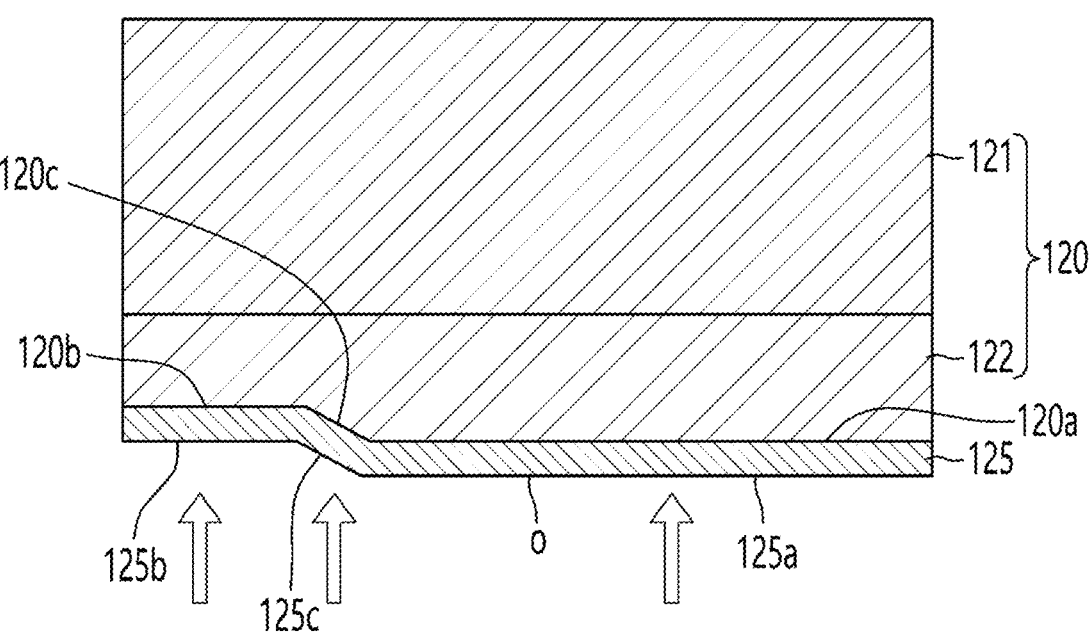

[FIG. 11]
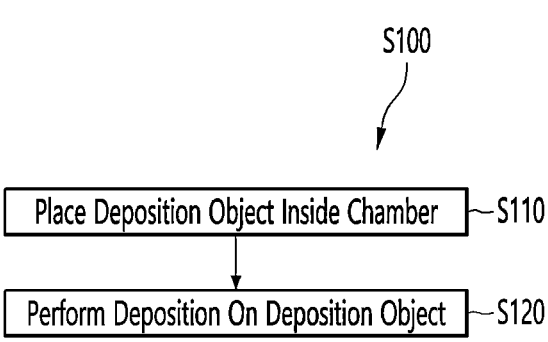

THIN FILM FORMING APPARATUS AND METHOD

CROSS-REFERENCE TO RELATED APPLICATION

This application claims priority from Korean Patent Application No. 10-2022-0126196 filed on Oct. 4, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a thin-film forming apparatus and method.

2. Description of the Related Art

Regarding thin film formation, plasma-resistant physical vapor deposition (PVD) coating needs to be improved in step coverage. During PVD, the difference in the mean free path by the distance between the deposition means and the object to undergo deposition (hereinafter, deposition object) makes it difficult to secure the uniformity of deposition for each part of the coating layer on the deposition object. For example, since the deposition particles move in a straight line during PVD, the deposition efficiency decreases when the deposition particles go an increased distance. Additionally, an inclined portion of the deposition object is susceptible to a reduced uniformity of deposition thickness, necessitating improvement of the step coverage which, however, is not easy to improve.

Specifically, in the deposition, the particles fell off the target move straight toward the destination, and as their travel distance increases to farther areas compared to an area with a shorter distance, e.g., when taking deflected paths compared to moving straight, etc., the increased mean free path leads to a decreased deposition efficiency. With an inclined or stepped portion included, the base material undergoing deposition has its deposition rate decreased compared to the flat portion thereof, which may deteriorate the uniformity of deposition thickness over the entire area. To overcome this vulnerability, there have been attempts made toward improvements by rotating, revolving, or tilting the deposition object to which the particles are guided, but even after all these, technology is yet provided to facilitate improvement in the step coverage by surface location on the deposition object. For example, objects with locally stepped contours are difficult to receive improved deposition.

PRIOR ART LITERATURE

Patent Documents

Korean Patent Registration No. 10-1802384

SUMMARY

Aspects of the present disclosure improve the step coverage of the plasma-resistant PVD coating on an object in relation to the thin film formation.

Another aspect of the present disclosure provides a technology for ensuring deposition uniformity during PVD operation for each part of the coating layer on the target with a difference in mean free path according to the distance between the deposition means and the target.

Yet another aspect of the present disclosure provides a technology for improving the step coverage in response to differences in thickness uniformity of deposition across the target at its flat portion, inclined portion, depression, etc.

Yet another aspect of the present disclosure provides a technology for eliminating a decrease in deposition efficiency due to the particles falling off the target, being subject to an increase in the mean free path as the particles move in a straight line to a farther destination by an increased distance compared to a nearer destination, e.g., left and right side areas compared to the central area of the target, etc.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a thin-film forming apparatus including a chamber configured to hold a vacuum formed in the chamber, a deposition object placed at a set position inside the chamber, a sputtering target placed inside the chamber and containing particles for deposition, a gas supply module configured to supply a gas for forming a plasma state inside the chamber, a step-coverage control module located inside the chamber and facing the deposition object, and a voltage supply module located inside the chamber and configured to supply an electric current to the sputtering target. Here, the deposition object is deposited with the particles provided from the sputtering target based on the electric current. The step-coverage control module is configured to control a step coverage of the deposition object by adjusting the amount of the particles moving toward the deposition object through a repositioning maneuver.

According to another aspect of the present disclosure, there is provided a thin-film forming apparatus includes a chamber configured to hold a vacuum formed in the chamber, a deposition object placed at a set position inside the chamber, a sputtering target placed inside the chamber and including particles for deposition, a gas supply module configured to supply a gas for forming a plasma state inside the chamber, a step-coverage control module located inside the chamber and facing the deposition object, and a voltage supply module located inside the chamber and configured to supply an electric current to the sputtering target. Here, the deposition object is deposited with the particles provided from the sputtering target based on the electric current. The step-coverage control module is configured to control a step coverage of the deposition object by adjusting the amount of the particles moving toward the deposition object through a repositioning maneuver. The step-coverage control module includes a central part arranged to sandwich the deposition object with the sputtering target and configured to adjust the amount of the particles moving toward the deposition object. The central part takes a 1-1st motion approaching a surface of the deposition object and a 1-2nd motion departing from the deposition object to help to adjust the amount of the particles moving toward the deposition object. The step-coverage control module further comprises a first outer part located on one side of the central part to face the deposition object and configured to adjust the amount of the particles moving toward the deposition object. The first outer part is configured to perform a 2-1st motion of approaching the central part and a 2-2nd motion of departing from the central part, and to take the 2-1st motion and the 2-2nd motion to help to adjust the amount of the particles moving toward the deposition object. The step-coverage control module further comprises a second outer part located on the other side of the central part to face the deposition object and configured to adjust the amount of the particles moving toward the deposition object. The second outer part takes a 2-1st motion of approaching the central part and a 2-2nd motion of departing from the central part to help to adjust the amount of the particles moving toward the deposition object. The first outer part is configured to perform a 2-3rd motion of approaching a surface of the deposition object and a 2-4th motion of departing from the surface of the deposition object, and to take the 2-1st motion to the 2-4th motion to help to adjust the amount of the particles moving toward the deposition object. The second outer part is configured to perform a 3-3rd motion of approaching a surface of the deposition object and a 3-4th motion of departing from the deposition object, and to take the 3-1st motion to the 3-4th motion to help to adjust the amount of the particles moving toward the deposition object. The deposition object includes a deposition object surface formed with a flat portion and includes a depression recessed in contrast to the flat portion. The step-coverage control module is configured to reinforce a step coverage between the flat portion and the depression of the deposition object.

According to yet another aspect of the present disclosure, there is provided a thin-film forming method including mounting a deposition object on a step-coverage control module inside a chamber, and performing deposition on the deposition object mounted on the step-coverage control module. Here, the chamber has a sputtering target that is placed inside the chamber and contains particles for the deposition, and the chamber is supplied, through a gas supply module, with a gas for forming a plasma state inside the chamber. The sputtering target receives an electric current from a voltage supply module for the deposition. The deposition object is deposited with the particles provided from the sputtering target based on the electric current. The step-coverage control module controls the step coverage of the deposition object by adjusting the amount of the particles moving toward the deposition object through a repositioning maneuver.

According to the thin-film forming apparatus and method of the present disclosure as described above, one or more of the following effects are provided.

The present disclosure can improve the step coverage of the plasma-resistant PVD coating on the target in relation to the thin film formation.

Additionally, the present disclosure can ensure deposition uniformity during PVD operation for each part of the coating layer on the target with a difference in mean free path according to the distance between the deposition means and the target.

Further, the present disclosure can improve the step coverage in response to differences in thickness uniformity of deposition across the target at its flat portion, inclined portion, depression, etc.

Further, the present disclosure can eliminate a decrease in deposition efficiency due to the particles falling off the target, being subject to an increase in the mean free path as the particles move in a straight line to a farther destination by an increased distance compared to a nearer destination, e.g., left and right side areas compared to the central area of the target, etc.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which:

FIG. 1 is a block diagram showing the components of a thin-film forming apparatus according to at least one embodiment of the present disclosure.

FIG. 2 is a schematic diagram illustrating a configuration according to FIG. 1.

FIGS. 3 to 9 are diagrams illustrating example operation states of the configuration according to FIG. 2.

FIGS. 10A and 10B are diagrams showing example deposition objects based on FIG. 2.

FIG. 11 is a flowchart sequentially illustrating a thin-film forming method according to at least one embodiment of the present disclosure.

| | |
|---|---|
| 1: control module | 10: drive module |
| 11: first drive module | 12: second drive module |
| 13: third drive module | 100: thin-film forming apparatus |
| 110: step cover control module | 120: deposition object |
| 125: deposition object | 130: sputtering target |
| 140: gas supply module | 150: voltage supply module |

DETAILED DESCRIPTION OF THE EMBODIMENTS

Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims. Like reference numerals refer to like elements throughout the specification.

Spatially relative terms, such as "below," "beneath," "lower," "above," "upper," and the like, may be used herein for ease of description to convey one object's or feature's relationship to another object(s) or feature(s) as illustrated in the drawings. It will be understood that the spatially relative terms are intended to encompass different orientations of the object in use or operation in addition to the orientation depicted in the drawings. For example, when objects in the drawings are turned over, objects described as "below" or "beneath" other objects or features would then be oriented "above" the other objects or features. Thus, the illustrative term "below" can encompass both an orientation of above and below. The object may be otherwise oriented (rotated 90 degrees or at other orientations), and the spatially relative descriptors used herein may be interpreted accordingly.

It will be understood that, although the terms first, second, etc. may be used herein to describe various objects, components, and/or sections, these objects, components, and/or sections should not be limited by these terms. These terms are only used to distinguish one object, component, or section from another object, component, or section. Thus, a first object, first component, or first section discussed below could be termed a second object, second component, or second section without departing from the teachings of the present disclosure.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, objects and/or components, but do not preclude the presence or addition of one or more other features, integers, steps, operations, objects, components and/or groups thereof. Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, some embodiments of the present disclosure will be described in detail with reference to the accompanying drawings. In the following description, like reference numerals designate like elements, although the elements are shown in different drawings. Further, in the following description of some embodiments, a detailed description of related known components and functions when considered to obscure the subject of the present disclosure will be omitted for the purpose of clarity and for brevity.

Referring to FIG. 1, a thin-film forming apparatus 100 according to at least one embodiment of the present disclosure includes a control module 1, a driving module 10, a chamber 110, a sputtering target 130, a gas supply module 140, a voltage supply module 150, and a step-coverage control module 160.

Additionally, the control module 1 performs the overall control of the thin-film forming apparatus 100. The driving module 10 includes a first driving module 11, a second driving module 12, and a third driving module 13. (as in FIG. 2)

Referring to FIG. 2, the step-coverage control module 160 includes a central part 161, a first outer part 162, and a second outer part 163. The chamber 110 has an internal space for accommodating the deposition object 120.

The deposition object 120 is held in position by a separate mounting means inside the chamber 110. The chamber 110 of the thin-film forming apparatus 100 has a vacuum state formed in the internal accommodation space. The deposition object 120 is placed at a set position inside the chamber 110.

The sputtering target 130 is located inside the chamber 110 and includes particles for deposition. The gas supply module 140 is for supplying gas for forming a plasma state inside the chamber 110.

The step-coverage control module 160 of this configuration is located inside the chamber 110 and is adapted to face the deposition object 120. The voltage supply module 150 is located inside the chamber 110 and supplies a voltage to the sputtering target 130. Here, the electric current includes, say, the negative voltage.

The deposition object 120 is deposited with particles provided from the sputtering target 130 based on the supplied electric current. The step-coverage control module 160 adjusts the amount of the particles moving toward the deposition object 120 through a repositioning maneuver to control the step coverage of the deposition object 120.

Here, the central part 161 of the step-coverage control module 160 is disposed to sandwich the deposition object 120 with the sputtering target 130. The central part 161 helps to adjust the amount of the particles moving toward the deposition object 120.

The central part 161 guides particles toward the deposition object, and for this purpose, performs a 1-1st motion and a 1-2nd motion. The 1-1st motion includes an operation for the central part 161 to approach the surface of the deposition object 120. (FIGS. 3 and 4)

The 1-2nd motion includes an operation for the central part 161 to depart from the deposition object 120. The central part 161 takes the 1-1st motion and the 1-2nd motion to guide the particles while helping to adjust the amount of the particles moving toward the deposition object 120. (FIGS. 3 and 4)

The first outer part 162 of the step-coverage control module 160 is located on one side of the central part 161 to face the deposition object 120. The first outer part 162 guides the particles that move toward the deposition object 120. (FIGS. 2, 5, and 6)

Additionally, the first outer part 162 performs 2-1st to 2-4th motions. Among them, the 2-1st motion includes an operation for the first outer part 162 to approach the central part 161. (FIGS. 5 and 6)

The 2-2nd motion includes an operation for the first outer part 162 to depart from the central part 161. The first outer part 162 takes the 2-1st motion and the 2-2nd motion to help to adjust the amount of the particles moving toward the deposition object 120. (FIGS. 5 and 6)

Additionally, the second outer part 163 of the step-coverage control module 160 is located on the other side of the central part 161. The second outer part 163 faces the deposition object 120.

Facing the deposition object 120, the second outer part 163 helps to adjust the amount of the particles moving toward the deposition object 120. (FIGS. 3 and 5)

The second outer part 162 performs 3-1st to 3-4th motions. Here, the 3-1st motion includes an operation for the second outer part 162 to approach the central part 161. The 3-2nd motion includes an operation for the second outer part 162 to depart from the central part 161. (FIGS. 3 and 7)

The second outer part 162 takes the 3-1st motion and the 3-2nd motion to help to adjust the amount of the particles moving toward the deposition object 120. (FIGS. 2, 3, and 7)

The 2-3rd motion of the first outer part 162 includes its operation of approaching downwardly toward the surface of the deposition object 120. The 2-4th motion of the first outer part 162 includes its operation of departing upwardly from the surface of the deposition object 120. (FIGS. 4 and 9)

The first outer part 162 takes the 2-3rd motion and the 2-4th motion to help to adjust the amount of the particles moving toward the deposition object 120. The 3-3rd motion of the second outer part 162 includes its operation of approaching downwardly toward the surface of the deposition object 120. (FIGS. 3 and 4)

Meanwhile, the 3-4th motion of the second outer part 162 includes the operation of the second outer part 162 departing upwardly from the surface of the deposition object 120.

(FIG. 9) Additionally, the first outer part 162 may perform a first combined motion and a second combined motion.

The first combined motion includes the 2-1st motion and the 2-2nd motion. The second combined motion includes the 2-1st to 2-4th motions. (FIGS. 5, 6, and 9)

The second outer part 163 adjusts the amount of the particles moving toward the deposition object 120 through a third combined motion and a fourth combined motion. The third combined motion includes the 3-1st motion and the 3-2nd motion.

The fourth combined motion includes the 3-1st motion to the 3-4th motion. (FIGS. 5, 6, and 9) The deposition object 120 includes, on its surface subject to deposition, a flat portion 120a, a depression 120b that is recessed in contrast to the flat portion 120a, and an inclined portion 120c. (FIGS. 10A and 10B)

Here, the flat portion 120a is a region formed to be flat as an object surface portion on which deposition is performed. The depression 120b is a recessed region in contrast to the flat portion 120a. (FIGS. 10A and 10B)

The inclined portion 120c is an inclined region between the flat portion 120a and the depression 120b. The step-coverage control module 160 reinforces the step coverage between the flat portion 120a and the depression 120b of the deposition object 120. (FIGS. 1, 10A, and 10B)

A first coating layer 125a is formed on the flat portion 120a based on the deposition. A second coating layer 125b is formed on the depression 120b based on the deposition. A third coating layer 125c is formed on the inclined portion 120c based on the deposition. (FIGS. 1, 10A, and 10B)

Here, the step-coverage control module 160 is to reinforce the step coverage between the first coating layer 125a to the third coating layer 125c. The central part 161, the first outer part 162, and the second outer part 163 are supplied with an anode voltage to guide the particles.

It should be understood that the anode voltage may be supplied through the voltage supply module 150 or a separate means. The central part 161 is interlocked with the first driving module 11 for the repositioning maneuver.

The first outer part 162 is interlocked with the second driving module 12 for the repositioning maneuver. The second outer part 163 is interlocked with the third driving module 13 for the repositioning maneuver. The first driving module 11 to the third driving module 13 may well be provided separately or integrally.

The particles coming from the sputtering target 130 toward the deposition object 120 include the first to third particles. The first particles include those moving in at least a first path L1 toward the central part 161 of the step-coverage control module 160.

The central part 161 takes the 1-1st motion and the 1-2nd motion to control the momentum of the first particles on at least the first path L1. (FIGS. 2 to 4)

The second particles include those that are directed toward the first outer part 162 but moving in a second path L2 that is at least one lateral departure direction from the first path L1. The first outer part 162 takes the 2-1st motion and the 2-2nd motion to help to control the momentum of the second particles on at least the second path L2. (FIGS. 2, 3, and 8)

The third particles include those moving toward the second outer part 162 but moving in at least a third path L3 that is in the other lateral departure direction from the first path L1. (FIGS. 2, 3, and 8)

Additionally, the second outer part 162 takes the 3-1st motion and the 3-2nd motion to help to control the momentum of the third particles on at least the third path L3. (FIGS. 2, 3, and 6)

The step-coverage control module 160 helps to reinforce the step coverage in the deposition object 120 between the flat portion 120a, the depression 120b, and the inclined portion 120c. (FIGS. 2, 10A, and 10B)

Additionally, the deposition object 120 may be provided in different forms including a unitary form, as well as a multilayered form of a first target 121 and a second target 122 which may undergo the deposition process. (FIGS. 2, 10A, and 10B)

The central part 121 is preferably spaced apart from the deposition object 120 within a range of about 0 to 20 cm. The first outer part 162 and the second outer part 163 preferably have a range of left and right spacing within a range of 0 to 10 cm from the virtual central axis of the deposition object 120.

Referring to FIG. 11, a thin-film forming method S100 according to at least one embodiment of the present disclosure includes mounting the deposition object 120 on the step-coverage control module 160 inside the chamber 110 (S110). The deposition object 120 mounted on the step-coverage control module 160 is subjected to the above-described step coverage reinforcement before undergoing the deposition process.

Here, placed inside the chamber 110 is the sputtering target 130 containing the particles for the deposition. Additionally, the gas for forming a plasma state is supplied to the chamber 110 through the gas supply module 140.

The sputtering target 130 receives an electric current from the voltage supply module 150 for the deposition. The deposition object 120 is deposited with the particles provided from the sputtering target 130 based on the electric current (S120).

Additionally, the step-coverage control module 160 adjusts the amount of the particles moving toward the deposition object 120 through the repositioning maneuver for allowing the step coverage of the deposition object 120 to be controlled.

The step-coverage control module 160 is arranged to sandwich the deposition object 120 with the sputtering target 130. The step-coverage control module 160 causes the central part 161 to adjust the amount of the particles moving toward the deposition object 120.

Here, the central part 161 takes the 1-1st motion approaching the surface of the deposition object 120 and the 1-2nd motion departing from the deposition object 120 to help to adjust the amount of the particles moving toward the deposition object 120.

The first outer part 162 of the step-coverage control module 160 is located on one side of the central part 161. The first outer part 162 faces the deposition object 120 and helps to adjust the amount of the particles moving toward the deposition object 120.

Additionally, the first outer part 162 may perform a 2-1st motion of approaching the central part 161 and a 2-2nd motion of departing from the central part 161. The first outer part 162 takes the 2-1st motion and the 2-2nd motion to help to adjust the amount of the particles moving toward the deposition object 120.

While a few exemplary embodiments of the present disclosure have been described with reference to the accompanying drawings, those skilled in the art will readily appreciate that various changes in form and details may be made therein without departing from the technical idea and scope of the present disclosure as defined by the following claims. Therefore, it is to be understood that the foregoing is illustrative of the present disclosure in all respects and is not to be construed as limited to the specific exemplary embodiments disclosed.

The invention claimed is:

1. A thin-film forming apparatus, comprising:
a chamber configured to hold a vacuum formed in the chamber;
a deposition object placed at a set position inside the chamber;
a sputtering target placed inside the chamber and containing particles for deposition;
a gas supply module configured to supply a gas for forming a plasma state inside the chamber;
a step-coverage control module located inside the chamber and facing the deposition object; and
a voltage supply module located inside the chamber and configured to supply an electric current to the sputtering target,
wherein the deposition object is deposited with the particles provided from the sputtering target based on the electric current, and
wherein the step-coverage control module is configured to control an amount of the particles moving toward the deposition object through a repositioning maneuver to control a step coverage of the deposition object,
wherein the step-coverage control module has a central part, a first outer part, and a second outer part, and
wherein the first and second outer parts are movably located on one side and an other side of the central part, respectively, and configured to be movable toward or away from the central part disposed between the first outer part and the second outer part to adjust the amount of the particles moving toward the deposition object, and wherein the first and second outer parts have a stepped shape.

2. The thin-film forming apparatus of claim 1, wherein the central part is arranged to sandwich the deposition object with the sputtering target and configured to adjust the amount of the particles moving toward the deposition object.

3. The thin-film forming apparatus of claim 2, wherein the central part takes a motion approaching a surface of the deposition object and a motion departing from the deposition object to help to adjust the amount of the particles moving toward the deposition object.

4. The thin-film forming apparatus of claim 3, wherein the first outer part located on the one side of the central part faces the deposition object and is configured to adjust the amount of the particles moving toward the deposition object.

5. The thin-film forming apparatus of claim 4, wherein the first outer part is configured to perform a motion of approaching the central part and a motion of departing from the central part, and to take the motion of approaching the central part and the motion of departing from the central part to help to adjust the amount of the particles moving toward the deposition object.

6. The thin-film forming apparatus of claim 5, wherein the second outer part located on the other side of the central part faces the deposition object and is configured to adjust the amount of the particles moving toward the deposition object.

7. The thin-film forming apparatus of claim 6, wherein the second outer part takes the motion of approaching the central part and the motion of departing from the central part to help to adjust the amount of the particles moving toward the deposition object.

8. The thin-film forming apparatus of claim 7, wherein the particles toward the deposition object from the sputtering target comprise:
first particles that move in at least a first path toward the central part;
second particles directed toward the first outer part while moving along at least a second path that is a departure direction on one side from the first path; and
third particles directed toward the second outer part while moving along at least a third path that is a departure direction on another side from the first path.

9. The thin-film forming apparatus of claim 8, wherein the central part takes the motion approaching the surface of the deposition object and the motion departing from the deposition object to control a momentum of the first particles on at least the first path.

10. The thin-film forming apparatus of claim 8, wherein the first outer part takes the motion of approaching the central part and the motion of departing from the central part to control a momentum of the second particles on at least the second path.

11. The thin-film forming apparatus of claim 8, wherein the second outer part takes one or more motions of controlling a momentum of the third particles on at least the third path.

12. The thin-film forming apparatus of claim 5, wherein the first outer part is configured to perform a motion of approaching a surface of the deposition object and a motion of departing from the surface of the deposition object, and to take the motion of approaching the surface of the deposition object and the motion departing from the surface of the deposition object to help to adjust the amount of the particles moving toward the deposition object.

13. The thin-film forming apparatus of claim 7, wherein the second outer part is configured to perform a motion of approaching a surface of the deposition object and a motion of departing from the deposition object, and to take the motion of approaching the surface of the deposition object and the motion of departing from the deposition object to help to adjust the amount of the particles moving toward the deposition object.

14. The thin-film forming apparatus of claim 3, wherein the deposition object includes a deposition object surface formed with a flat portion and includes a depression recessed in contrast to the flat portion, and
wherein the step-coverage control module is configured to reinforce a step coverage between the flat portion and the depression of the deposition object.

15. The thin-film forming apparatus of claim 1, wherein:
the deposition object is arranged between the step-coverage control module and the sputtering target,
the step-coverage control module includes the central part arranged on a side opposite to a side facing the sputtering target of the deposition object and configured to control an amount of the particles moving toward the deposition object, and
the step-coverage control module is configured to control the central part to adjust the amount of the particles moving toward the deposition object by a motion approaching a surface of the deposition object and a motion departing from the deposition object.

16. The thin-film forming apparatus of claim 1, wherein the central part disposed between the first outer part and the second outer part is configured to be movable toward or away from the deposition object to adjust the amount of the particles moving toward the deposition object.

17. A thin-film forming apparatus, comprising:

a chamber configured to hold a vacuum formed in the chamber;

a deposition object placed at a set position inside the chamber;

a sputtering target placed inside the chamber and including particles for deposition;

a gas supply module configured to supply a gas for forming a plasma state inside the chamber;

a step-coverage control module located inside the chamber and facing the deposition object; and a voltage supply module located inside the chamber and configured to supply an electric current to the sputtering target, wherein the deposition object is deposited with the particles provided from the sputtering target based on the electric current, wherein the step-coverage control module is configured to control an amount of the particles moving toward the deposition object through a repositioning maneuver to control a step coverage of the deposition object, wherein the step-coverage control module includes a central part arranged to sandwich the deposition object with the sputtering target of the deposition object and configured to control an amount of the particles moving toward the deposition object, wherein the step-coverage control module is configured to control the central part to adjust the amount of the particles moving toward the deposition object by a motion approaching a surface of the deposition object and a motion departing from the deposition object to, wherein the step-coverage control module further comprises a first outer part located on one side of the central part to face the deposition object and configured to adjust the amount of the particles moving toward the deposition object, wherein the first outer part is configured to perform a motion of approaching the central part and a motion of departing from the central part, and to take the motion of approaching the central part and the motion of departing from the central part to help to adjust the amount of the particles moving toward the deposition object, wherein the step-coverage control module further comprises a second outer part located on an other side of the central part to face the deposition object and configured to adjust the amount of the particles moving toward the deposition object, wherein the second outer part takes the motion of approaching the central part and the motion of departing from the central part to help to adjust the amount of the particles moving toward the deposition object, wherein the first outer part is configured to perform a motion of approaching a surface of the deposition object and a motion of departing from the surface of the deposition object, and to take the motion of approaching the central part to the motion of departing from the surface of the deposition object to help to adjust the amount of the particles moving toward the deposition object, wherein the second outer part is configured to perform a motion of approaching a surface of the deposition object and a motion of departing from the deposition object, and to take one or more motions for helping to adjust the amount of the particles moving toward the deposition object, wherein the deposition object includes a deposition object surface formed with a flat portion and includes a depression recessed in contrast to the flat portion, wherein the step-coverage control module is configured to reinforce a step coverage between the flat portion and the depression of the deposition object, wherein the first and second outer parts are movably located on the one side and the other side of the central part, respectively, and configured to be movable toward or away from the central part disposed between the first outer part and the second outer part to adjust the amount of the particles moving toward the deposition object, and wherein the first and second outer parts have a stepped shape.

18. The thin-film forming apparatus of claim 17, wherein:

the deposition object is arranged between the step-coverage control module and the sputtering target, and the central part is arranged on a side opposite to a side facing the sputtering target of the deposition object.

*   *   *   *   *